(12) United States Patent
Kim et al.

(10) Patent No.: US 8,723,018 B2
(45) Date of Patent: May 13, 2014

(54) SOLAR CELL AND METHOD OF MANUFACTURING THE SAME

(75) Inventors: Jonghwan Kim, Seoul (KR); Hyungjin Kwon, Seoul (KR); Daeyong Lee, Seoul (KR)

(73) Assignee: LG Electronics Inc., Seoul (KR)

( * ) Notice: Subject to any disclaimer, the term of this patent is extended or adjusted under 35 U.S.C. 154(b) by 625 days.

(21) Appl. No.: 12/566,524

(22) Filed: Sep. 24, 2009

(65) Prior Publication Data

US 2010/0275993 A1  Nov. 4, 2010

(30) Foreign Application Priority Data

Jun. 29, 2009  (KR) .................. 10-2009-0058182

(51) Int. Cl.
*H01L 31/00* (2006.01)

(52) U.S. Cl.
USPC ........... 136/255; 136/252; 136/256; 136/257; 136/258; 438/93

(58) Field of Classification Search
USPC .................. 136/252, 255, 257, 258, 256; 257/E31.038; 438/57
See application file for complete search history.

(56) References Cited

U.S. PATENT DOCUMENTS 6,639,143 B2 * 10/2003 Kim et al. ............... 136/256
7,294,779 B2 * 11/2007 Watabe et al. ........... 136/256
2003/0037815 A1   2/2003 Kim et al.
2006/0060238 A1 * 3/2006 Hacke et al. ............ 136/256
2009/0217682 A1   9/2009 Son

FOREIGN PATENT DOCUMENTS

| AU | 2006291683 A1 | 3/2007 |
| EP | 1943473 A2 | 7/2008 |
| JP | 2002-270869 A | 9/2002 |
| JP | 2007-299844 A | 11/2007 |
| JP | 2008-172279 A | 7/2008 |

* cited by examiner

*Primary Examiner* — Matthew Martin
(74) *Attorney, Agent, or Firm* — Birch, Stewart, Kolasch & Birch, LLP

(57) ABSTRACT

A solar cell and a method of manufacturing the same are disclosed. The solar cell includes a substrate of a first conductive type; an emitter layer of a second conductive type opposite the first conductive type; at least one first electrode on the emitter layer and electrically connected to the emitter layer; a passivation layer on the substrate, the passivation layer including a plurality of exposing portions to expose respective portions of the substrate; and an electrode conductive layer on the passivation layer, the electrode conductive layer including a plurality of second electrodes electrically connected to the respective plurality of exposing portions, wherein in each of the plurality of exposing portions, an area of an exposed surface of the substrate is greater than an area of a virtual interface that is coplanar with an interface between the substrate and the passivation layer and which is located over the exposed surface.

14 Claims, 10 Drawing Sheets

SOLAR CELL AND METHOD OF MANUFACTURING THE SAME

This application claims priority to and the benefit of Korean Patent Application No. 10-2009-0058182 filed in the Korean Intellectual Property Office on Jun. 29, 2009, the entire contents of which are incorporated herein by reference.

BACKGROUND OF THE INVENTION

1. Field of the Invention

Embodiments relate to a solar cell and a method of manufacturing the same.

2. Description of the Related Art

Recently, as existing energy sources such as petroleum and coal are expected to be depleted, interests in alternative energy sources for replacing the existing energy sources are increasing. Among the alternative energy sources, solar cells have been particularly spotlighted because, as cells for generating electric energy from solar energy, the solar cells are able to draw energy from an abundant source and do not cause environmental pollution.

A general solar cell includes a substrate and an emitter layer, formed of a semiconductor, each having a different conductive type such as a p-type and an n-type, and electrodes respectively formed on the substrate and the emitter layer. The general solar cell also includes a p-n junction formed at an interface between the substrate and the emitter layer.

When light is incident on the solar cell, a plurality of electron-hole pairs are generated in the semiconductor. Each of the electron-hole pairs is separated into electrons and holes by the photovoltaic effect. Thus, the separated electrons move to the n-type semiconductor (e.g., the emitter layer) and the separated holes move to the p-type semiconductor (e.g., the substrate), and then the electrons and holes are collected by the electrodes electrically connected to the emitter layer and the substrate, respectively. The electrodes are connected to each other using electric wires to thereby obtain an electric power.

SUMMARY OF THE INVENTION

Embodiments provide a solar cell and a method of manufacturing the same capable of improving an operation efficiency of the solar cell.

In one aspect, there is a solar cell comprising a substrate of a first conductive type, an emitter layer of a second conductive type opposite the first conductive type on the substrate, at least one first electrode electrically connected to the emitter layer, a passivation layer on the substrate, the passivation layer including a plurality of exposing portions exposing portions of the substrate, and an electrode conductive layer on the passivation layer, the electrode conductive layer including a plurality of second electrodes electrically connected to the exposed portions of the substrate exposed by the exposing portions, wherein in each exposed portion, a size of an exposed surface of the substrate is greater than a size of a virtual interface between the substrate and the passivation layer.

Each of the plurality of exposing portions may include an over-etching portion having the exposed surface of the substrate.

Each of the plurality of over-etching portions may have a height ranging from the virtual interface to the substrate, and the heights of the plurality of over-etching portions may be equal to one another.

The height may be approximately 1 μm to 40 μm.

Angles between the plurality of exposing portions and the passivation layer may vary depending on a formation location of the passivation layer.

The plurality of exposing portions may include at least one exposing portion substantially perpendicular to the passivation layer and at least one exposing portion inclined to the passivation layer. The at least one exposing portion substantially perpendicular to the passivation layer may be positioned in the substantial center of the substrate, and the least one exposing portion inclined to the passivation layer may be positioned at an edge of the substrate. An inclined angle between the at least one exposing portion inclined to the passivation layer and the passivation layer may decrease as the at least one exposing portion approaches the edge of the substrate.

A plurality of exposing portions formed in the passivation layer along a first direction may have the same angle with respect to the passivation layer, and a plurality of exposing portions formed in the passivation layer along a second direction different from the first direction each may have different angles with respect to the passivation layer.

The plurality of exposing portions formed along the second direction may be inclined to the passivation layer. Inclined angles between the plurality of exposing portions formed along the second direction and the passivation layer may increase as the exposing portions formed along the second direction approach an edge of the substrate.

An angle between the at least one exposing portion positioned in the substantial center of the substrate and the least one exposing portion positioned at the edge of the substrate may be within about 45°.

A width of each of the exposing portions may be approximately 10 μm to 100 μm.

The passivation layer and the first electrode may be positioned on the substrate to be opposite to each other.

A number of layers constituting the passivation layer may be equal to or greater than 2.

In another aspect, there is a solar cell comprising a substrate of a first conductive type, an emitter layer of a second conductive type opposite the first conductive type on the substrate, at least one first electrode electrically connected to the emitter layer, a passivation layer on the substrate, the passivation layer including a plurality of exposing portions exposing portions of the substrate, each of the plurality of exposing portions including an over-etching portion having a predetermined height in a direction from a virtual interface between the substrate and the passivation layer to the substrate, and an electrode conductive layer on the passivation layer, the electrode conductive layer including a plurality of second electrodes electrically connected to the portions of the substrate exposed by the exposing portions.

A vertical cross-sectional shape of each of the exposing portions may include a circle, an oval, a polygon, or a stripe. Each of the over-etching portions may have a hemispherical shape, a conic shape, or a polygon pyramid shape.

The exposing portions may have substantially the same vertical cross-sectional shape as the over-etching portions.

The predetermined height of each of the over-etching portions may vary depending on a measured location of the predetermined height in each of the over-etching portions.

The plurality of exposing portions may include a plurality of exposing portions inclined to the passivation layer. A measured location of a maximum height of each of the over-etching portions may vary depending on an inclined direction of the exposing portions inclined to the passivation layer.

The predetermined height of each of the over-etching portions may vary depending on a measured location of the predetermined height in each of the over-etching portions. A measured location of a maximum height of each of the over-etching portions may vary depending on a formation location of the exposing portions.

The maximum height of the over-etching portion may be approximately 1 μm to 40 μm.

The plurality of over-etching portions may include at leas two over-etching portions each having a different shape.

In another aspect, there is a method of manufacturing a solar cell comprising forming an emitter layer of a second conductive type opposite a first conductive type on one surface of a substrate of the first conductive type, forming an anti-reflection layer on the emitter layer, stacking a passivation layer on another surface of the substrate, removing portions of the passivation layer and a portions of the substrate to form a plurality of exposing portions exposing portions of the substrate, forming a first electrode electrically connected to the emitter layer, and forming a plurality of second electrodes electrically connected to the portions of the substrate exposed by the plurality of exposing portions.

The forming of the first electrode may comprise forming a first electrode pattern on the anti-reflection layer and then performing a thermal process on the first electrode pattern to form the first electrode electrically connected to the emitter layer.

The thermal process may be simultaneously performed in the forming of the first electrode and the forming of the second electrodes.

The method may further comprise forming a back surface field (BSF) layers between the second electrodes and the substrate.

The BSF layers may be formed through the thermal process.

The forming of the BSF layers may comprise forming the plurality of exposing portions on the passivation layer and injecting impurities into the plurality of exposing portions using the passivation layer as a mask.

The forming of the plurality of exposing portions may comprise irradiating a laser beam on portions of the passivation layer.

The laser beam may have a wavelength of about 355 nm and a pulse width of about 1 μm.

The forming of the plurality of exposing portions may comprise removing the passivation layer and portions of the substrate to a depth of about 1 μm to 40 μm from a surface of the substrate abutting on the passivation layer.

In another aspect, there is a solar cell including a substrate of a first conductive type; an emitter layer of a second conductive type opposite the first conductive type on the substrate; at least one first electrode on the emitter layer and electrically connected to the emitter layer; a passivation layer on the substrate, the passivation layer including a plurality of exposing portions to expose respective portions of the substrate; and an electrode conductive layer on the passivation layer, the electrode conductive layer including a plurality of second electrodes electrically connected to the respective plurality of exposing portions of the substrate, wherein in each of the plurality of exposing portions, an area of an exposed surface of the substrate is greater than an area of a virtual interface that is coplanar with an interface between the substrate and the passivation layer and which is located over the exposed surface of the substrate.

In another aspect, there is a solar cell including a substrate of a first conductive type; an emitter layer of a second conductive type opposite the first conductive type on the substrate; at least one first electrode electrically connected to the emitter layer; a passivation layer on the substrate, the passivation layer including a plurality of exposing portions to expose respective portions of the substrate, each of the plurality of exposing portions including an indented portion in the substrate having a predetermined height in a direction from a virtual interface to the substrate, the virtual interface being coplanar with an interface between the substrate and the passivation layer and being located over the indented portion of the substrate; and an electrode conductive layer on the passivation layer, the electrode conductive layer including a plurality of second electrodes electrically connected to the respective portions of the substrate exposed by the exposing portions.

In another aspect, there is a method of manufacturing a solar cell including forming an emitter layer of a second conductive type opposite a first conductive type on one surface of a substrate of the first conductive type; forming an anti-reflection layer on the emitter layer; forming a passivation layer on another surface of the substrate; forming a plurality of exposing portions that exposes portions of the substrate; forming a first electrode electrically connected to the emitter layer; and forming a plurality of second electrodes to be electrically connected to the exposed portions of the substrate.

Further scope of applicability of the present invention will become apparent from the detailed description given hereinafter. However, it should be understood that the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
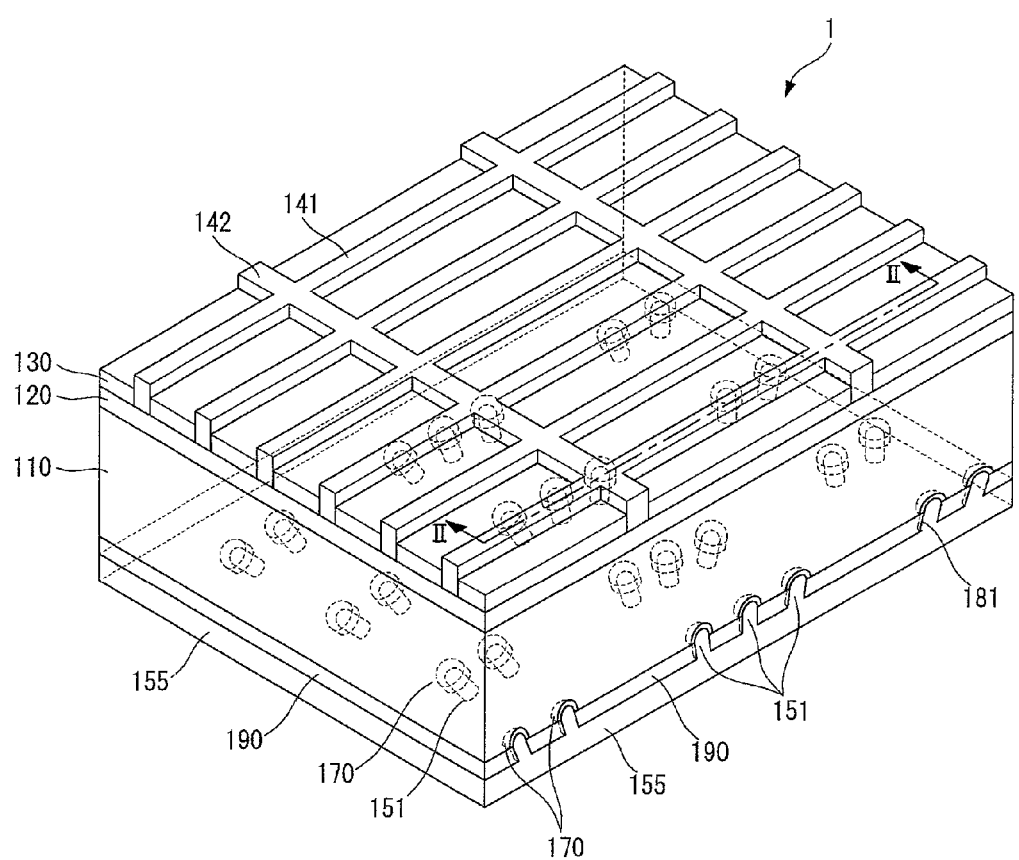
FIG. 1 is a partial perspective view of a solar cell according to an example embodiment.

The invention will be described more fully hereinafter with reference to the accompanying drawings, in which example embodiments of the inventions are shown. This invention may, however, be embodied in many different forms and should not be construed as limited to the embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Figure 2:
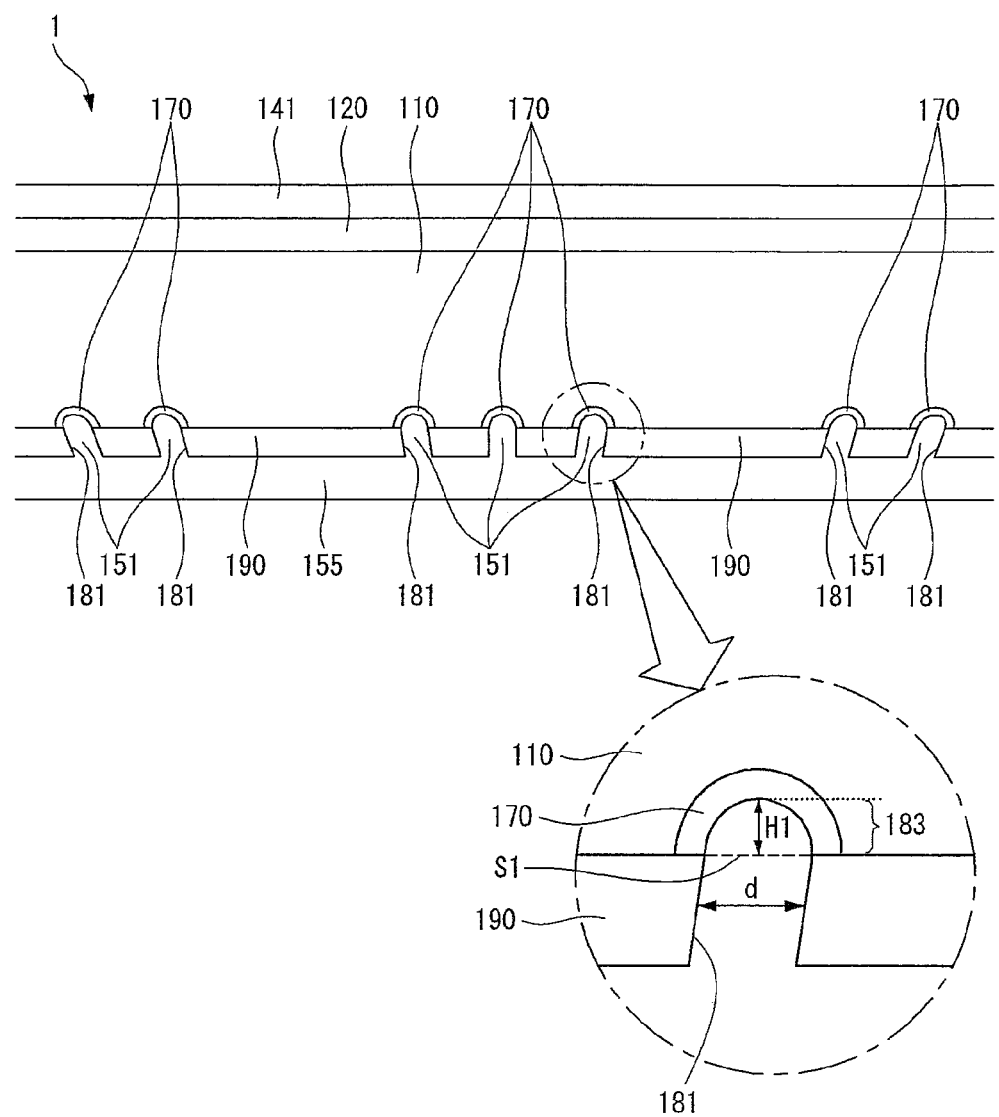
FIG. 2 is a cross-sectional view taken along line II-II of FIG. 1.
Figure 3:
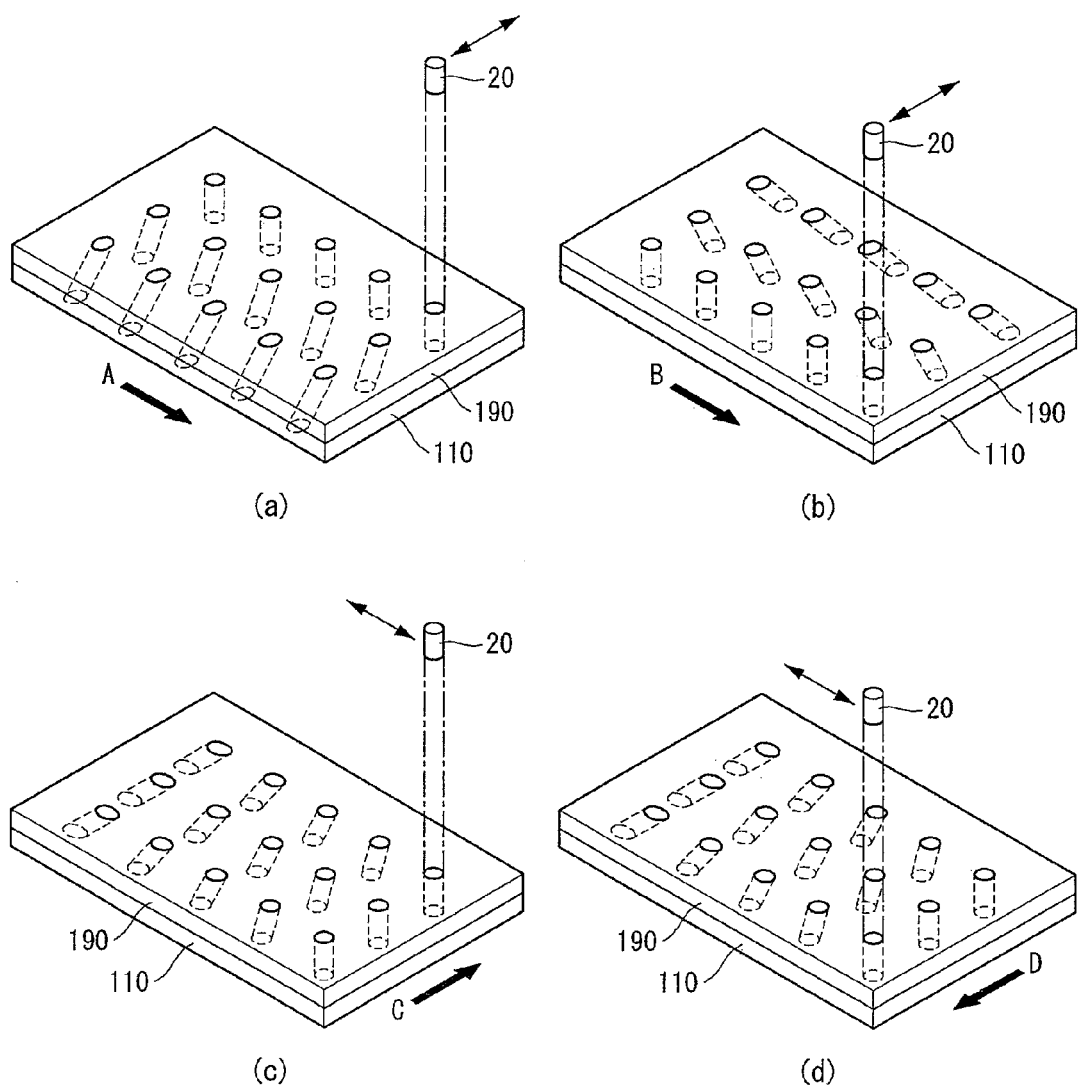
FIG. 3 illustrates various examples of an angle and a horizontal cross-sectional shape of an exposing portion depending on an irradiation location of a laser beam and a moving direction of a substrate according to an example embodiment.
Figure 4:
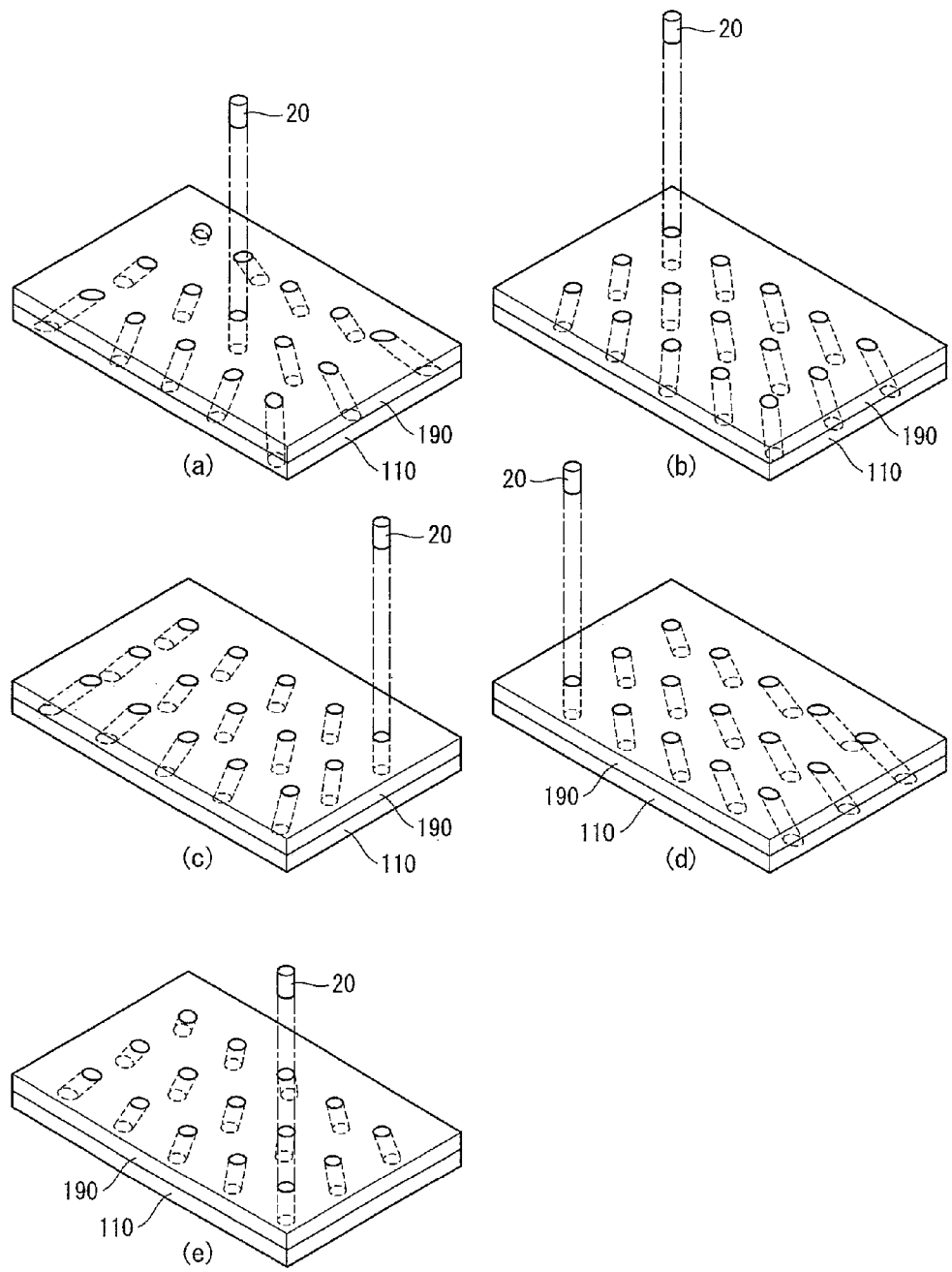
FIG. 4 illustrates various examples of an angle and a horizontal cross-sectional shape of an exposing portion depending on an initial location of an exposing portion formation device according to an example embodiment.
Figure 5:
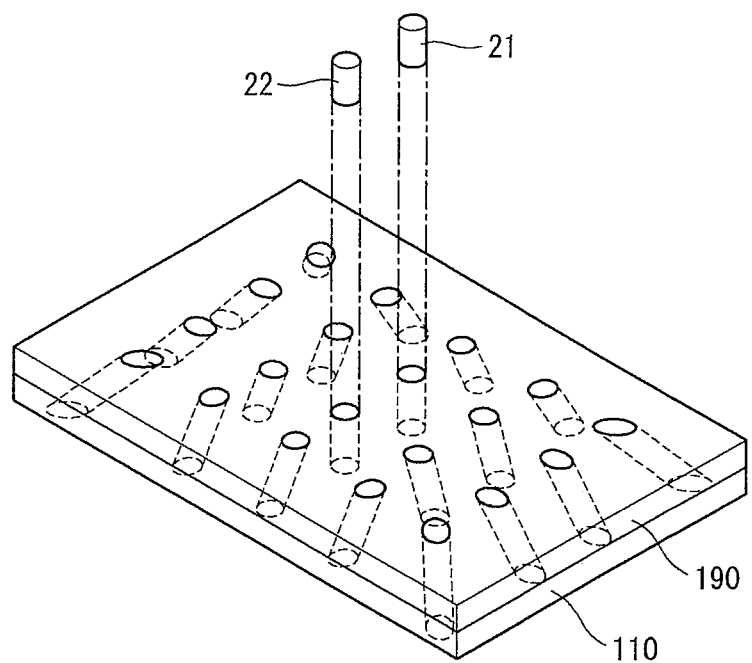
FIG. 5 illustrates an angle and a horizontal cross-sectional shape of a plurality of exposing portions depending on a location of a substrate when the plurality of exposing portions are formed using two exposing portion formation devices according to an example embodiment.
Figure 6:
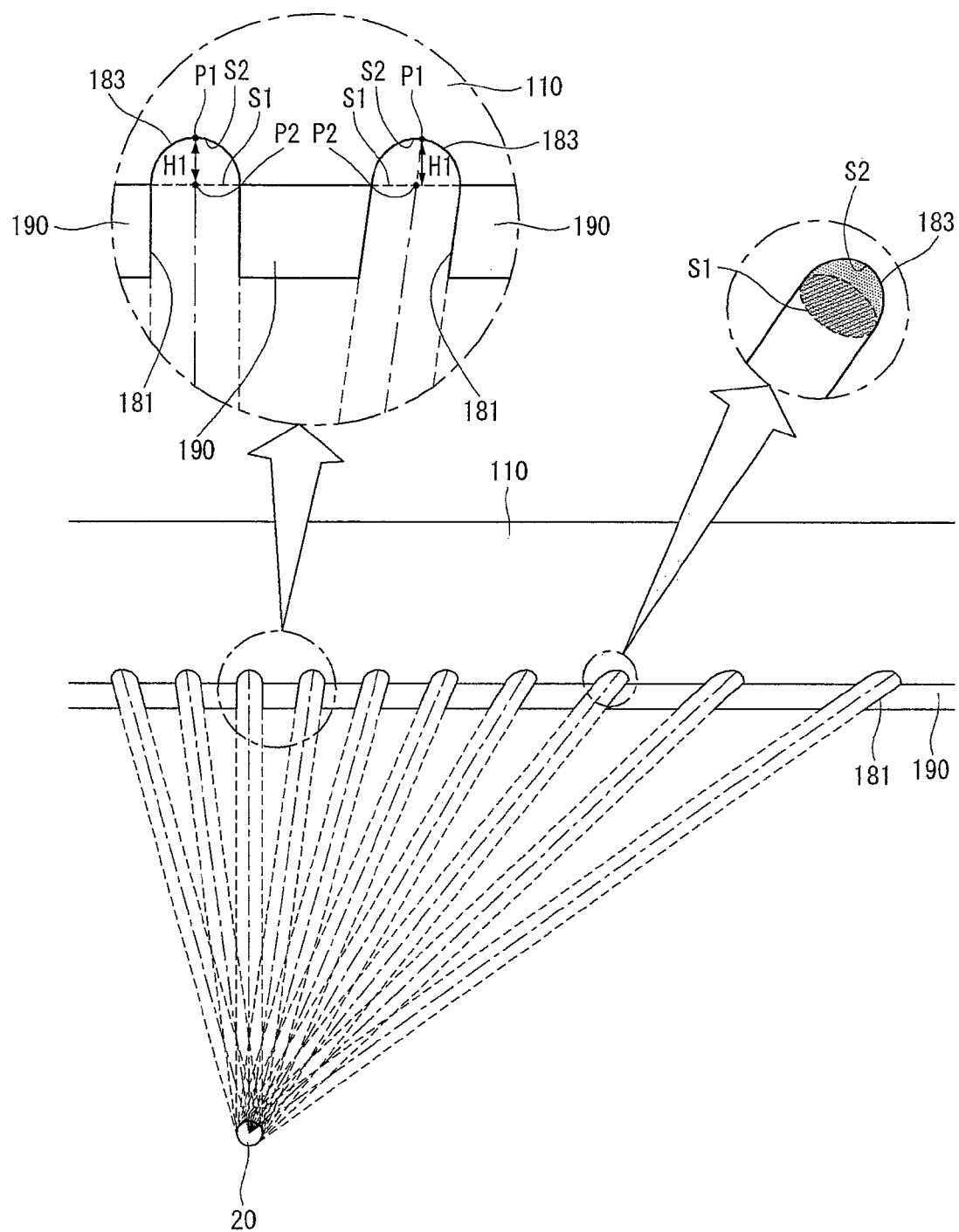
FIG. 6 illustrates changes in an over-etching portion depending on an angle of an exposing portion with respect to a passivation layer according to an example embodiment.
Figure 7:
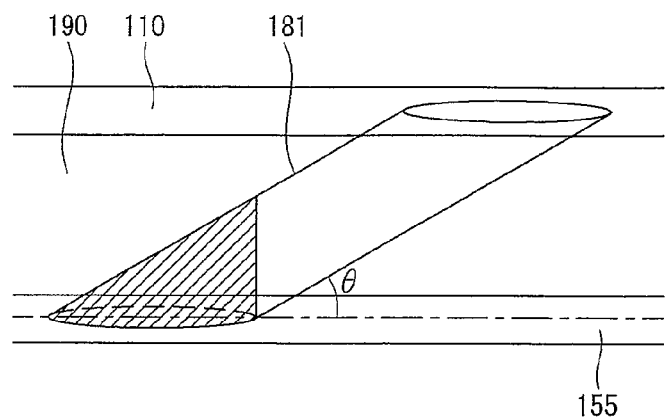
FIG. 7 illustrates an amount of rear electrode existing in an inner space of an exposing portion according to an example embodiment.

FIG. 1 is a partial perspective view of a solar cell according to an example embodiment. FIG. 2 is a cross-sectional view taken along line II-II of FIG. 1. FIG. 3 illustrates various examples of an angle and a horizontal cross-sectional shape of an exposing portion depending on an irradiation location of a laser beam and a moving direction of a substrate. FIG. 4 illustrates various examples of an angle and a horizontal cross-sectional shape of an exposing portion depending on an initial location of an exposing portion formation device. FIG. 5 illustrates an angle and a horizontal cross-sectional shape of a plurality of exposing portions depending on a location of a substrate when the plurality of exposing portions are formed using two exposing portion formation devices. FIG. 6 illustrates changes in an over-etching portion depending on an angle of an exposing portion with respect to a passivation layer. FIG. 7 illustrates an amount of rear electrode existing in an inner space of an exposing portion.

As shown in FIG. 1, a solar cell 1 according to an embodiment includes a substrate 110, an emitter layer 120 on an incident surface (hereinafter, referred to as "a front surface") of the substrate 110, on which light is incident, an anti-reflection layer 130 on the emitter layer 120, a passivation layer 190 on a rear surface of the substrate 110 opposite the front surface of the substrate 110, a plurality of front electrodes 141 electrically connected to the emitter layer 120, a plurality of front electrode current collectors 142, a rear electrode conductive layer 155, and a plurality of back surface field (BSF) layers 170. The plurality of front electrode current collectors 142 are connected to the plurality of front electrodes 141 and extend in a cross direction of the front electrode current collectors 142 and the front electrodes 141. The rear electrode conductive layer 155 is positioned on the passivation layer 190 and includes a plurality of rear electrodes 151 electrically connected to the substrate 110. The plurality of BSF layers 170 are positioned between the substrate 110 and the plurality of rear electrodes 151.

In the example embodiment, the substrate 110 may be formed of silicon doped with impurities of a first conductive type, for example, a p-type, though not required. Examples of silicon include single crystal silicon, polycrystalline silicon, and amorphous silicon. When the substrate 110 is of a p-type, the substrate 110 contains impurities of a group III element such as boron (B), gallium (Ga), and Indium (In). Alternatively, the substrate 110 may be of an n-type, and/or be made of other materials than silicon. When the substrate 110 is of the n-type, the substrate 110 may contain impurities of a group V element such as phosphor (P), arsenic (As), and antimony (Sb).

Unlike the configuration illustrated in FIGS. 1 and 2, the surface of the substrate 110 may be textured to form a textured surface corresponding to an uneven surface.

The emitter layer 120 is an impurity portion having a second conductive type (for example, an n-type) opposite the first conductive type of the substrate 110. The emitter layer 120 and the substrate 110 form a p-n junction.

A plurality of electron-hole pairs produced by light incident on the substrate 110 are separated into electrons and holes by a built-in potential difference resulting from the p-n junction. Then, the separated electrons move toward the n-type semiconductor, and the separated holes move toward the p-type semiconductor. Thus, when the substrate 110 is of the p-type and the emitter layer 120 is of the n-type, the separated holes and the separated electrons move to the substrate 110 and the emitter layer 120, respectively. Accordingly, the holes in the substrate 110 and the electrons in the emitter layer 120 become major carriers.

Because the substrate 110 and the emitter layer 120 form the p-n junction, the emitter layer 120 may be of the p-type when the substrate 110 is of the n-type unlike the embodiment described above. In this case, the separated electrons and the separated holes move to the substrate 110 and the emitter layer 120, respectively.

Returning to the embodiment when the emitter layer 120 is of the n-type, the emitter layer 120 may be formed by doping the substrate 110 with impurities of a group V element such as P, As, and Sb. On the contrary, when the emitter layer 120 is of the p-type, the emitter layer 120 may be formed by doping the substrate 110 with impurities of a group III element such as B, Ga, and In.

The anti-reflection layer 130 formed of silicon nitride (SiNx) and/or silicon oxide ($SiO_x$) is positioned on the emitter layer 120. The anti-reflection layer 130 reduces a reflectance of light incident on the substrate 110 and increases a selectivity of a predetermined wavelength band, thereby increasing the efficiency of the solar cell 1. The anti-reflection layer 130 may be omitted, if desired.

The passivation layer 190 is positioned on the rear surface of the substrate 110 to reduce a recombination of charges around the surface of the substrate 110 and to increase an inner reflectance of light passing through the substrate 110. Hence, a re-incidence of the light passing through the substrate 110 can increase. The passivation layer 190 has a single-layered structure or a multi-layered structure.

The passivation layer 190 includes a plurality of exposing portions 181 to expose portions of the substrate 110.

The plurality of exposing portions 181 are positioned to be spaced apart from one another at a constant distance of about 0.5 mm to 1 mm, for example. In the embodiment, a vertical cross-sectional shape of each of the exposing portions 181 obtained when the exposing portion 181 is cut in a direction perpendicular to a central axis of the exposing portion 181 is a circle, but is not limited thereto. For example, the vertical cross-sectional shape of the exposing portion 181 may have various shapes, such as an oval or a polygon.

An angle between each of the plurality of exposing portions 181 and the surface of the passivation layer 190 varies depending on a formation location of each of the exposing portions 181. More specifically, the plurality of exposing portions 181 include at least one exposing portion 181 formed substantially perpendicular to the surface of the passivation layer 190 and at least one exposing portion 181 inclined to the surface of the passivation layer 190. In this case, an inclined angle and an inclined direction of the exposing portion 181 with respect to the surface of the passivation layer 190 vary depending on a formation location of the exposing portion 181.

Further, a horizontal cross-sectional shape of the exposing portion 181 obtained when the exposing portion 181 is cut in a direction parallel to the surface of the passivation layer 190 varies depending on the angle between the exposing portion 181 and the surface of the passivation layer 190. Hence, a width d of each of the exposing portions 181 varies. In the embodiment, the width d of each of the exposing portions 181 is approximately 10 µm to 100 µm depending on the angle between the exposing portion 181 and the surface of the passivation layer 190. Thus, each of the exposing portions 181 has a cross-sectional area of about 100 µm² (=10 µm×10 µm) to 10,000 µm² (=100 µm×100 µm). When the cross-sectional area of the exposing portion 181 is less than about 100 µm², a contact strength between the rear electrodes 151 and the substrate 110 is reduced because of a small area of the exposed portion of the substrate 110 exposed by the exposing portions 181. Further, when the cross-sectional area of the exposing portion 181 is larger than about 10,000 µm², a function of the passivation layer 190 is reduced because of a reduction in an area of the passivation layer 190.

The cross-sectional area of the exposing portion 181 increases as the angle between the exposing portion 181 and the surface of the passivation layer 190 decreases, and the cross-sectional area of the exposing portion 181 decreases as the angle between the exposing portion 181 and the surface of the passivation layer 190 increases. For example, if a desired cross-sectional area of the exposing portion 181 is 100 µm², the exposing portion 181 may have a cross-sectional area close to about 100 µm² when the angle between the exposing portion 181 and the surface of the passivation layer 190 is about 90°. As the angle between the exposing portion 181 and the surface of the passivation layer 190 is close to about 0°, the cross-sectional area of the exposing portion 181 increases. Accordingly, as the number of the exposing portions 181 having the inclined angle less than about 90° increases, the number of the exposing portions 181 having a cross-sectional area larger than a desired cross-sectional area increases. In the embodiment, the inclined angle of the exposing portion 181 inclined to the surface of the passivation layer 190 may be an acute angle.

Accordingly, in the embodiment, the angle between each of the exposing portions 181 and the surface of the passivation layer 190 is approximately 45° to 90°, so that contact characteristic of the exposing portions 181 and operation characteristic of the passivation layer 190 are uniformized by reducing a deviation between the cross-sectional areas of the exposing portions 181, i.e., a deviation of contact areas between the substrate 110 and the rear electrodes 151. Therefore, among the angles between the exposing portions 181 and the surface of the passivation layer 190, a largest difference between a maximum angle and a minimum angle is about 45°.

As shown in FIG. 3, the angle between the exposing portion 181 and the surface of the passivation layer 190 varies depending on an irradiation location of an exposing portion formation device 20, for example, a laser beam irradiation device.

For example, the exposing portion 181 formed in a portion of the passivation layer 190 closest to the irradiation location of the laser beam irradiation device 20 (i.e., a portion of the passivation layer 190 on which a laser beam output from the laser beam irradiation device 20 is incident at an angle of about 90°) has an angle close to 90° with respect to the surface of the passivation layer 190. On the contrary, the exposing portion 181 formed in a portion of the passivation layer 190 farthest away from the irradiation location of the laser beam irradiation device 20 (i.e., a portion of the passivation layer 190 on which the laser beam is incident at an angle of about 45°) has an angle close to 45° with respect to the surface of the passivation layer 190.

As shown in FIG. 3, when the plurality of exposing portions 181 are formed in the passivation layer 190, an angle, a horizontal cross-sectional shape, a cross-sectional area, etc. of each of the exposing portions 181 vary depending on a location relationship between the substrate 110 and the laser beam irradiation device 20, an irradiation (operation) direction of the substrate 110 or the laser beam irradiation device 20, etc.

In other words, as shown in FIG. 3, the plurality of exposing portions 181 may be formed while moving both the substrate 110, on which the passivation layer 190 is formed, and the laser beam irradiation device 20.

In FIG. 3, (a) and (b) show the exposing portions 181 formed in the passivation layer 190 when the substrate 110 moves in the direction of an arrow "A" or "B" (approximately an X-axis direction) and the laser beam irradiation device 20 irradiates a laser beam while moving up and down. As shown in (a) and (b) of FIG. 3, the exposing portions 181 foamed in the same row have substantially the same angle with respect to the surface of the passivation layer 190, and the exposing portions 181 formed in different rows have different angles with respect to the surface of the passivation layer 190. The angles of the exposing portion 181 decreases as the exposing portion 181 moves to the lower side (refer to (a) of FIG. 3) or the upper side (refer to (b) of FIG. 3) of the substrate 110, and thus a width of the horizontal cross-sectional shape of the exposing portion 181 increases. Namely, the horizontal cross-sectional shape of the exposing portion 181 becomes close to a circle as the exposing portion 181 moves to the lower side (refer to (a) of FIG. 3) or the upper side (refer to (b) of FIG. 3) of the substrate 110. Hence, the cross-sectional area of the exposing portion 181 may be close to a desired cross-sectional area (at this time, the angle of the exposing portion 181 is about 90°).

In FIG. 3, (c) and (d) show the exposing portions 181 formed in the passivation layer 190 when the substrate 110 moves in the direction of an arrow "C" or "D" (approximately, a Y-axis direction) and the laser beam irradiation device 20 irradiates a laser beam while moving left and right. As shown in (c) and (d) of FIG. 3, the exposing portions 181 formed in the same column have substantially the same angle with respect to the surface of the passivation layer 190, and the exposing portions 181 formed in different columns have different angles with respect to the surface of the passivation layer 190. Accordingly, the angle of the exposing portion 181 decreases as the exposing portion 181 moves to the left side of the substrate 110. The horizontal cross-sectional shape of the exposing portion 181 becomes close to a circle as the exposing portion 181 moves to the right side of the substrate 110. Hence, the cross-sectional area of the exposing portion 181 may be close to a desired cross-sectional area.

As described above, when the plurality of exposing portions 181 are formed while moving both the substrate 110 and the laser beam irradiation device 20 in a predetermined direction, the angles of the exposing portions 181 vary depending on their positions, and so the horizontal cross-sectional shape and the cross-sectional area of each exposing portion 181 also vary depending on their positions. Further, at least two exposing portions 181 having the same angle are formed in a moving direction of the substrate 110 and an irradiation direction of the laser beam irradiation device 20. In particular, there exists a row or a column consisting of exposing portions 181 having the same angle according to an arrangement form of the exposing portions 181 (for example, in a case where the predetermined number of exposing portions 181 are arranged in a matrix form in the row and column directions of the substrate 110).

Consequently, the angle (and the horizontal cross-sectional shape and the cross-sectional area) of each exposing portion 181 varies depending on an irradiation distance between the laser beam irradiation device 20 and the passivation layer 190 varying depending on a location of the passivation layer 190. The angle of the exposing portion 181 decreases as the irradiation distance increases. Further, the exposing portions 181 formed using laser beams having different irradiation distances have different angles (and different horizontal cross-sectional shapes and different cross-sectional areas), and the exposing portions 181 formed using laser beams having the same irradiation distance have substantially the same angle (and the same horizontal cross-sectional shape and the same cross-sectional area). Because an inclined direction of each exposing portion 181 is affected by the irradiation direction of the laser beam, the exposing portions 181 having the same inclined angle (and the same horizontal cross-sectional shape and the same cross-sectional area) may be inclined in different directions.

Moreover, the laser beam irradiation device 20 may irradiate a laser beam in various directions other than the irradiation directions shown in FIG. 3, and the substrate 110 may move in various directions other than the moving directions of the substrate 110 shown in FIG. 3. Even in this case, the angle, the horizontal cross-sectional shape, and the cross-sectional area of each exposing portion 181 vary depending on the irradiation distance of the laser beam.

Unlike the examples illustrated in FIG. 3, in some examples illustrated in FIG. 4, the plurality of exposing portions 181 may be formed in the substrate 110 by fixing the substrate 110 having the passivation layer 190 and then changing only the irradiation location of the laser beam irradiation device 20.

FIG. 4 illustrates various examples of an angle and a horizontal cross-sectional shape of an exposing portion depending on an initial location of an exposing portion formation device according to an example embodiment.

The substrate 110 is positioned at an initial location corresponding to a location of the laser beam irradiation device 20 for forming the exposing portions 181, and then the exposing portions 181 are formed at corresponding locations of the passivation layer 190 while changing an irradiation direction of the laser beam irradiation device 20. In the embodiment, a location of the laser beam irradiation device 20 corresponding to the substrate 110 when the substrate 110 moves to the initial location is referred to as an initial location of the laser beam irradiation device 20. Consequently, the laser beam irradiation device 20 forms the exposing portions 181 while changing the irradiation direction of the laser beam at its initial location.

In FIG. 4, (a) illustrates an example where the initial location of the laser beam irradiation device 20 corresponds to a substantial center of the substrate 110; (b) illustrates an example where the initial location of the laser beam irradiation device 20 is an upper left corner of the substrate 110; (c) illustrates an example where the initial location of the laser beam irradiation device 20 is an upper right corner of the substrate 110; (d) illustrates an example where the initial location of the laser beam irradiation device 20 is a lower left corner of the substrate 110; and (e) illustrates an example where the initial location of the laser beam irradiation device 20 is a lower right corner of the substrate 110.

As shown in FIG. 4, an irradiation angle of a laser beam becomes small as the laser beam irradiation device 20 becomes distant from its initial location in which an angle of the laser beam irradiation device 20 with respect to the substrate 110, i.e., an irradiation angle of the laser beam is kept at about 90° (i.e., as an irradiation distance of the laser beam irradiation device 20 becomes long). Accordingly, the angles of the exposing portions 181 decreases and the cross-sectional areas of the exposing portions 181 increase as the irradiation distance of the laser beam irradiation device 20 becomes long. That is to say, when the vertical cross-sectional shape of the exposing portion 181 is a circle, the horizontal cross-sectional shape of the exposing portion 181 becomes close to a circle as the irradiation distance of the laser beam irradiation device 20 from its initial location becomes shorter.

As shown in FIG. 4, because the inclined directions of the exposing portions 181 are related to the irradiation direction of the laser beam, the plurality of inclined exposing portions 181 are inclined toward an exposing portion 181 having a maximum angle. That is, the plurality of inclined exposing portions 181 is inclined toward the initial location of the laser beam irradiation device 20.

As described above with reference to FIG. 3, in FIG. 4, the horizontal cross-sectional shape, the cross-sectional area, and the angle of each of the exposing portions 181 formed in the passivation layer 190 vary depending on the irradiation distance of the laser beam varying depending on the location of the passivation layer 190. Accordingly, the exposing portions 181 formed at the same irradiation distance from the initial location have the same angle with respect to the passivation layer 190, and the exposing portions 181 formed at different irradiation distances from the initial location have different angles with respect to the passivation layer 190. Consequently, the angles (and the horizontal cross-sectional shapes and the cross-sectional areas) of the exposing portions 181 formed at the same distance from an exposing portion 181 having a maximum angle are equal to one another.

FIGS. 3 and 4 illustrate the examples where the exposing portions 181 are formed in corresponding portions of the passivation layer 190 using one exposing portion formation device 20. However, in some examples, the plurality of exposing portions 181 may be formed using at least two exposing portion formation devices.

For example, as shown in FIG. 5, the plurality of exposing portions 181 may be formed using two exposing portion formation devices 21 and 22. In this case, angles of the exposing portions 181 formed by the exposing portion formation device 21 may be equal to angles of the exposing portions 181 formed by the exposing portion formation device 22, and thus horizontal cross-sectional shapes and cross-sectional areas may be equal to one another. That is to say, the number of exposing portions 181 each having an angle may be equal to the number of exposing portion formation devices.

Further, as shown in FIGS. 3 to 5, because the inclined direction of the exposing portion 181 is related to the irradiation direction of the laser beam, the inclined exposing portions 181 are inclined toward the exposing portion 181 having the maximum angle.

The above-described exposing portions 181 may be formed in a predetermined area of the substrate 110 over the surface of the substrate 110 as well as the passivation layer 190. More specifically, each of the exposing portions 181 includes a portion occupying an area ranging from a contact surface (i.e., a virtual interface S1) between a virtual surface of the substrate 110 and the passivation layer 190 to a predetermined portion of the substrate 110, and the portion is referred to as an over-etching portion 183 (or an indented portion 183). In other words, each of the exposing portions 181 includes the over-etching portion 183 that passes through the passivation layer 190 and projects from the exposing portion 181. The over-etching portion 183 is described below with reference to FIG. 6.

FIG. 6 illustrates changes in an over-etching portion depending on an angle of the exposing portion 181 with respect to the passivation layer 190.

Because each of the plurality of over-etching portions 183 has a maximum width substantially equal to a width of the corresponding exposing portion 181, the maximum width of each of the over-etching portions 183 is approximately 10 μm to 100 μm.

Further, each of the over-etching portions 183 has a predetermined height H1 starting from the virtual interface S1 between the passivation layer 190 and the substrate 110.

In the embodiment, it is preferable that the heights H1 of the plurality of over-etching portions 183 corresponding to the plurality of exposing portions 181 are substantially equal to one another. For example, each of the over-etching portions 183 has the maximum height H1 of about 1 μm to 40 μm, and may be about 2 μm to 20 μm. Because a vertical cross-sectional shape of each of the over-etching portions 183 is substantially the same as a vertical cross-sectional shape of the exposing portion 181, the vertical cross-sectional shape of the over-etching portions 183 includes a circle, an oval, or a polygon.

Accordingly, in the exposing portion 181 including the over-etching portion 183, a contact area between the substrate 110 and each rear electrode 151 increases because of the over-etching portion 183, and thus a sum of the contact areas of the rear electrodes 151 each contacting the substrate 110 increases as compared with the exposing portion not including the over-etching portion 183.

As described above with reference to FIGS. 3 to 5, because the angle of the exposing portion 181 varies depending on the location of the passivation layer 190, the shape of the over-etching portion 183 varies depending on changes in the angle of the exposing portion 181.

In the embodiment, an intensity of the laser beam irradiated onto the passivation layer 190 has a Gaussian distribution. Thus, a portion P1 of the over-etching portion 183 corresponding to a middle portion of the laser beam is positioned more deeply toward the substrate 110 than the over-etching portion 183 corresponding to an edge of the laser beam. Further, each of the over-etching portions 183 has a height ranging from the virtual interface S1 to an end of the over-etching portion 183 in a vertical direction, and the height of each over-etching portions 183 varies depending on a location of each over-etching portions 183. In other words, a height H1 ranging from the virtual interface S1 to the portion P1 of the over-etching portion 183 corresponding to the middle portion of the laser beam is a maximum height of the over-etching portion 183. In the embodiment, the portion P1 is referred to as a maximum height point.

As described above, because each of the over-etching portions 183 has a predetermined height extending from the virtual interface S1 and extends from the virtual interface S1, a size of a surface S2 (also referred to as an exposed surface) of the substrate 110 exposed by each over-etching portion 183 is greater than a size of the virtual interface S1. Because the height of the over-etching portion 183 varies depending on its location, the over-etching portion 183 may have a hemispherical shape or a conic shape when the vertical cross-sectional shape of the exposing portion 181 is a circle. Further, when the vertical cross-sectional shape of the exposing portion 181 is a polygon, the over-etching portion 183 may have a polygon pyramid shape. Accordingly, the exposed surface S2 may be smooth, may be irregular, or have sharp corners.

As described above, the angle of the exposing portion 181 varies depending on the location of the passivation layer 190. Thus, as the angle of the exposing portion 181 decreases, a cross-sectional area of the virtual interface S1 increases and the maximum height point P1 extending from a middle point P2 (hereinafter, referred to as a 'virtual middle point') of the virtual interface S1 moves in the inclined direction of the exposing portion 181.

In other words, the maximum height point P1 exists on an extension line of the virtual middle point P2. Thus, in the case of the exposing portion 181 having the angle of about 90°, the maximum height point P1 and the virtual middle point P2 exists on the same vertical line. However, in the case of the exposing portion 181 having the inclined angle less than about 90°, a vertical line passing through the virtual middle point P2 is different from a vertical line passing through the maximum height point P1. Here, the vertical line refers to a line perpendicular to the virtual interface S1.

A difference between the vertical line passing through the virtual middle point P2 and the vertical line passing through the maximum height point P1, hereinafter referred to as a shift of the maximum height point P1, becomes greater as the inclined angles becomes lesser. For example, the shift of the maximum height point P1 when an inclined angle is less than about 45° is greater than the degree of shift of the maximum height point P1 for when the inclined angle is greater than about 45°. The shift of the maximum height point P1 is greater for those exposing portions 181 that are further from the exposing portion formation device 20, or those at a location on the substrate 110 that is further from an exposing portion whose maximum height point P1 is not shifted, or very slightly shifted.

Accordingly, as shown in FIG. 6, as the angle of the exposing portion 181 decreases, the maximum height point P1 gradually moves in the inclined direction from the virtual middle point P2.

The plurality of front electrodes 141 are positioned on the emitter layer 120, are electrically connected to the emitter layer 120, and extend in a fixed direction to be spaced apart from one another. The front electrodes 141 collect charges (for example, electrons) moving to the emitter layer 120 and transfer the collected charges to the front electrode current collectors 142.

The plurality of front electrode current collectors 142 are positioned on the same level layer as the first electrodes 141 on the emitter layer 120 and extend in a cross direction of the front electrode current collectors 142 and the front electrodes 141. The front electrode current collectors 142 collect the charges transferred from the front electrodes 141 and output the charges to an external device.

The front electrodes 141 and the front electrode current collectors 142 are formed of at least one conductive material. More specifically, the front electrodes 141 and the front electrode current collectors 142 may be formed of at least one selected from the group consisting of nickel (Ni), copper (Cu), silver (Ag), aluminum (Al), tin (Sn), zinc (Zn), indium (In), titanium (Ti), gold (Au), and a combination thereof. Other conductive materials may be used.

The rear electrode conductive layer 155 is formed of a conductive material and is positioned on the passivation layer 190.

The rear electrode conductive layer 155 includes the plurality of rear electrodes 151 electrically connected to exposed portions of the substrate 110 exposed through the plurality of exposing portions 181. Accordingly, when the angle of each of the exposing portions 181 is less than about 45°, as shown in FIG. 7, a collecting operation of the rear electrodes 151 is distributed by a side wall of the exposing portion 181, and thus the rear electrodes 151 may exist in only a predetermined space of the exposing portion 181. In this case, because a normal contact between the rear electrodes 151 and the exposed substrate 110 is not achieved, an electrical connection between the rear electrodes 151 and the exposed substrate 110 may not be achieved. Accordingly, it is preferable that the angle of each of the exposing portions 181 is kept at about 45° to 90°, so as to easily bring the substrate 110 into contact with the rear electrodes 151 through the exposing portions 181.

In some examples, each of the rear electrodes 151 may have the same stripe shape as the front electrodes 141 and thus may extend in one direction while the rear electrodes 151 are electrically connected to the substrate 110. In this case, a vertical cross-sectional shape of the exposing portions 181 on the passivation 190 may be a stripe shape. As described above, a location of the maximum height point P1 of the over-etching portion 183 projecting from the exposing portion 181 varies depending on the angle of the exposing portion 181. Further, the number of rear electrodes 151 having the stripe shape is much less than the number of rear electrodes 151 having the circle, oval, or polygon shape.

The rear electrodes 151 collect charges (for example, holes) moving to the substrate 110 and transfer the collected charges to the rear electrode conductive layer 155. The rear electrode conductive layer 155 collect the charges transferred from the rear electrodes 151 and output the charges to an external device.

The plurality of BSF layers 170 are positioned between the plurality of rear electrodes 151 and the substrate 110. The BSF layers 170 are an area (for example, a p+-type area) that is more heavily doped with impurities of the same conductive type as the substrate 110 than the substrate 110.

The smooth movement of electrons to the rear surface of the substrate 110 is disturbed by a potential barrier resulting from a difference between impurity doping concentrations of the substrate 110 and the BSF layers 170. Accordingly, the BSF layers 170 prevent or reduce a recombination and/or a disappearance of the electrons and holes in an interface of the substrate 110 and the rear electrodes 151.

As described above, because the exposing portion 181 includes the over-etching portion 183 removing a portion of the substrate 110 as well as the passivation layer 190, the size of the substrate surface (or the exposed surface) S2 exposed by the exposing portion 181 increases by the size of the over-etching portion 183. Hence, the contact area between the substrate 110 and the rear electrodes 151 increases. In addition, a formation area of the BSF layer 170 increases by the size of the over-etching portion 183, and thus the recombination and/or the disappearance of the charges resulting from the BSF layer 170 are further reduced.

In the solar cell 1 according to the embodiment having the above-described structure, the passivation layer 190 is positioned on the rear surface of the substrate 110 to reduce the recombination and/or the disappearance of the charges resulting from unstable bonds existing in the surface of the substrate 110. An operation of the solar cell 1 will be below described in detail.

When light irradiated to the solar cell 1 is incident on the substrate 110 through the anti-reflection layer 130 and the emitter layer 120, a plurality of electron-hole pairs are generated in the substrate 110 by light energy based on the incident light. Hence, a reflection loss of light incident on the substrate 110 is reduced by the anti-reflection layer 130, and thus an amount of light incident on the substrate 110 further increases.

The electron-hole pairs are separated by the p-n junction of the substrate 110 and the emitter layer 120, and the separated electrons move to the n-type emitter layer 120 and the separated holes move to the p-type substrate 110. The electrons moving to the n-type emitter layer 120 are collected by the front electrodes 141 and then are transferred to the front electrode current collectors 142. The holes moving to the p-type substrate 110 are collected by the rear electrodes 151 and then are transferred to the rear electrode conductive layer 155. When the front electrode current collectors 142 are connected to the rear electrode conductive layer 155 using electric wires (not shown), current flows therein to thereby enable use of the current for electric power.

In the embodiment, because the passivation layer 190 having the single-layered structure or the multi-layered structure is positioned between the substrate 110 and the rear electrode conductive layer 155, the recombination and/or the disappearance of the charges resulting from unstable bonds existing in the surface of the substrate 110 are reduced and thus the operation efficiency of the solar cell 1 is improved.

The contact area between the substrate 110 and the rear electrodes 151 increases because of the over-etching portion 183 of each exposing portion 181, and a contact resistance between the substrate 110 and each rear electrode 151 decreases because of an increase in the contact area. Thus, a charge transfer efficiency is improved. Further, a formation area of the BSF layer 170 formed between the substrate 110 and the rear electrodes 151 increases because of the over-etching portion 183 of each exposing portion 181, and thus the recombination and/or the disappearance of electron and holes around the rear surface of the substrate 110 is further reduced. Hence, the operation efficiency of the solar cell 1 according to the embodiment is improved. Because the inclined angles of the exposing portion 181 is about 45° to 90°, the deviation between the cross-sectional areas of the exposing portions 181 and the deviation of the contact areas between the substrate 110 and the rear electrodes 151 are reduced. Hence, the contact characteristic of the exposing portions 181 inside the substrate 110 and the operation characteristic of the passivation layer 190 can be uniformized, and the operation efficiency of the solar cell 1 can be further improved. Further, because the electrical connection between the rear electrodes 151 and the substrate 110 is reliably achieved, a defective rate of the solar cell 1 can be reduced, and the operation efficiency of the solar cell 1 can be further improved.

Therefore, among the angles between the exposing portions 181 and the surface of the passivation layer 190, a largest difference between a maximum angle and a minimum angle is about 45°.

FIGS. 8A to 8G are cross-sectional views sequentially illustrating each of stages in a method of manufacturing a solar cell according to an example embodiment.

Figure 8A:
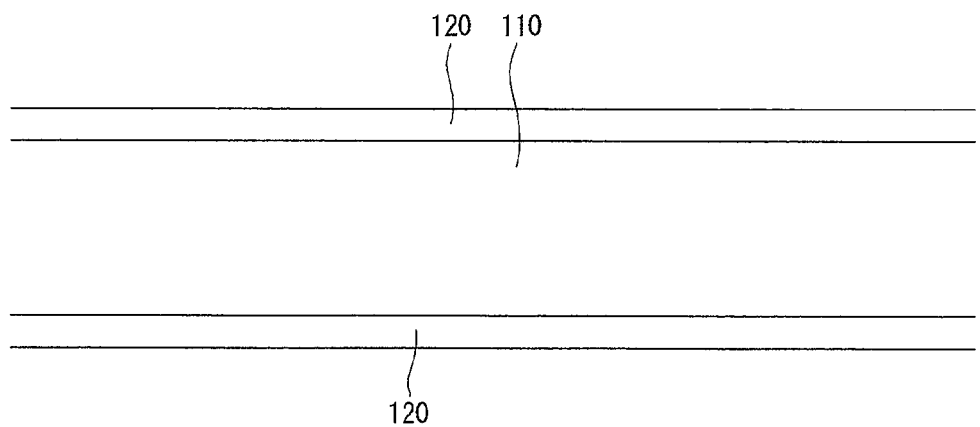
FIGS. 8A to 8G are cross-sectional views sequentially illustrating each of stages in a method of manufacturing a solar cell according to an example embodiment.

First, as shown in FIG. 8A, a high temperature thermal process of a material (for example, $POCl_3$ or $H_3PO_4$) containing impurities of a group V element such as P, As, and Sb is performed on a substrate 110 formed of p-type single crystal silicon or p-type polycrystalline silicon to distribute the group V element impurities on the substrate 110. Hence, an emitter layer 120 is formed on the entire surface of the substrate 110 including a front surface, a rear surface, and a side surface.

Unlike the embodiment, when the substrate 110 is of an n-type, a high temperature thermal process of a material (for example, $B_2H_6$) containing group III element impurities is performed on the substrate 110 or the material containing the group III element impurities is stacked on the substrate 110 to form the p-type emitter layer 120 on the entire surface of the substrate 110. Subsequently, phosphorous silicate glass (PSG) containing phosphor (P) or boron silicate glass (BSG) containing boron (B) produced when p-type impurities or n-type impurities are distributed inside the substrate 110 is removed through an etching process.

If necessary, before the emitter layer 120 is formed, a texturing process may be performed on the entire surface of the substrate 110 to form a textured surface of the substrate 110. When the substrate 110 is formed of single crystal silicon, the texturing process may be performed using a basic solution such as KOH and NaOH. When the substrate 110 is formed of polycrystalline silicon, the texturing process may be performed using an acid solution such as HF and $HNO_3$.

Figure 8B:
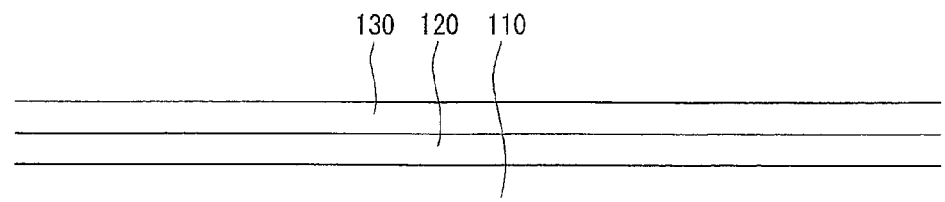

As shown in FIG. 8B, an anti-reflection layer 130 is formed on the substrate 110 using a chemical vapor deposition (CVD) method such as a plasma enhanced chemical vapor deposition (PECVD) method. In addition, the anti-reflection layer 130 may be formed inside the exposing portions 181.

Figure 8C:
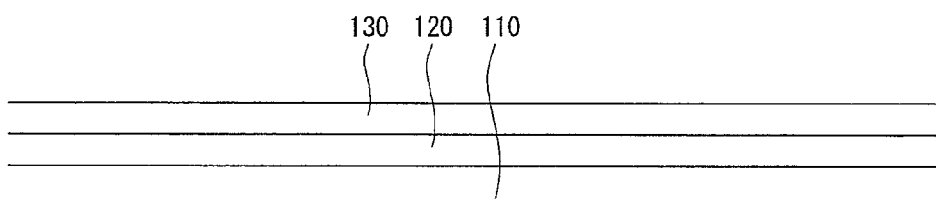

As shown in FIG. 8C, a portion of the rear surface of the substrate 110 is removed using a wet or dry etching method, and thus a portion of the emitter layer 120 on the rear surface of the substrate 110 is removed. Hence, the emitter layer 120 is completed.

Figure 8D:
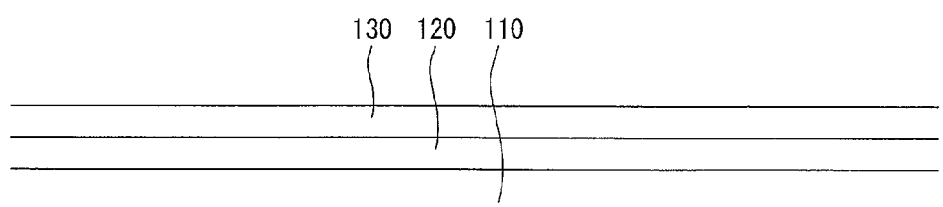
Figure 8D:
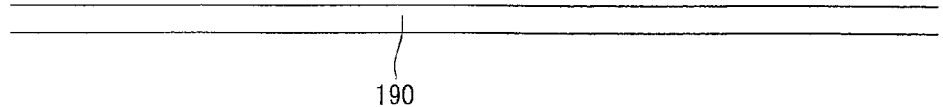

As shown in FIG. 8D, a passivation layer 190 is formed on the rear surface of the substrate 110 using the CVD method such as the PECVD method, a sputtering method, etc. The passivation layer 190 may have a single-layered structure including a silicon oxide ($SiO_x$) layer or a multi-layered structure including a silicon oxide ($SiO_x$) layer and a silicon nitride (SiNx) layer.

Figure 8E:
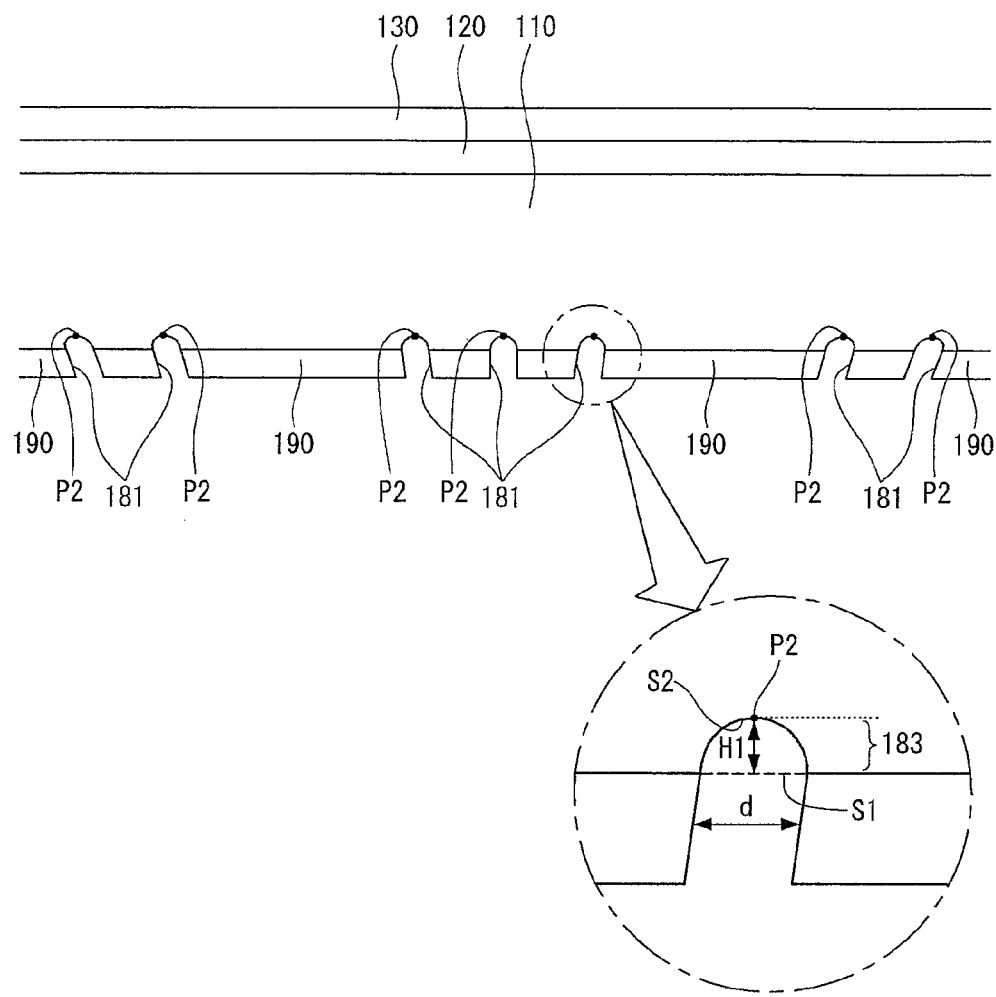

As shown in FIG. 8E, a laser beam is irradiated onto a corresponding portion to remove the passivation 190 and the substrate 110. Hence, a plurality of exposing portions 181 to expose portions of the substrate 110 is formed.

In this case, because angles of the plurality of exposing portions 181 formed depending on an irradiation distance of the laser beam vary, the exposing portions 181 perpendicular to the surface of the passivation layer 190 and the exposing portions 181 inclined to the surface of the passivation layer 190 exist, and also a width d of each exposing portion 181 varies depending on the angles of the exposing portions 181. In the embodiment, the width d of each exposing portion 181 is approximately 10 μm to 100 μm.

Each of the exposing portions 181 includes an over-etching portion 183 that occupies an area ranging from the surface of the substrate 110 to a predetermined portion of the substrate 110 and exposes a predetermined surface (the exposed surface) S2 of the substrate 110. A maximum height H1 of the over-etching portion 183 starting from a virtual interface S1 between the passivation layer 190 and the substrate 110 is approximately 1 μm to 40 μm, and may be approximately 2 μm to 20 μm. The maximum height H1 of the over-etching portion 183 may vary depending on a kind of laser beam, an irradiation intensity of laser beam, the number of irradiation operations of the laser beam, etc. The laser beam used in the embodiment has a wavelength of 355 nm and a pulse width equal to or less than about 1 μm, but the intensity and the wavelength of the laser beam used in the embodiment vary depending on a material or a thickness of the passivation layer 190. In the embodiment, it is preferable that the maximum heights H1 of the plurality of over-etching portions 183 on the substrate 110 are substantially equal to one another.

In some examples, when the plurality of rear electrodes 151 have a stripe shape, the exposing portions 181 have a stripe shape extending in a fixed direction. Thus, the over-etching portions 183, whose a location of a maximum height point P1 varies depending on the angles of the exposing portions 181, projecting from the exposing portions 181 have a stripe shape.

Figure 8F:
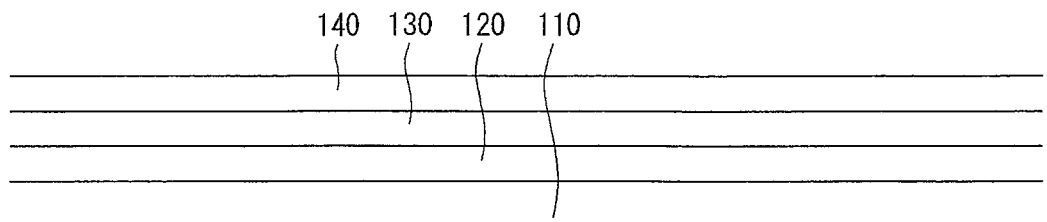
Figure 8F:
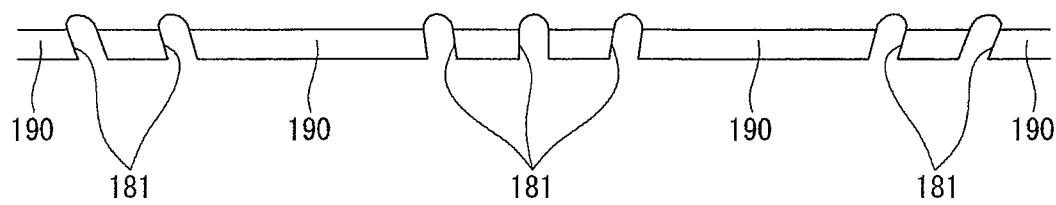

Next, as shown in FIG. 8F, a paste containing Ag is coated on a corresponding portion of the anti-reflection layer 130 using a screen printing method and then is dried at about 120° C. to 200° C. to form a front electrode and front electrode current collector pattern 140. The front electrode and front electrode current collector pattern 140 includes a front electrode pattern and a front electrode current collector pattern that cross each other and extend in a cross direction thereof. In the embodiment, a width of the front electrode current collector pattern may be greater than a width of the front electrode pattern. Other width relationships between the front electrode current collector pattern and the front electrode pattern may be used.

Figure 8G:
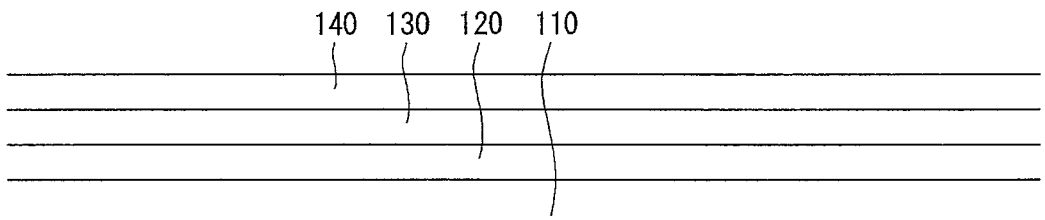
Figure 8G:
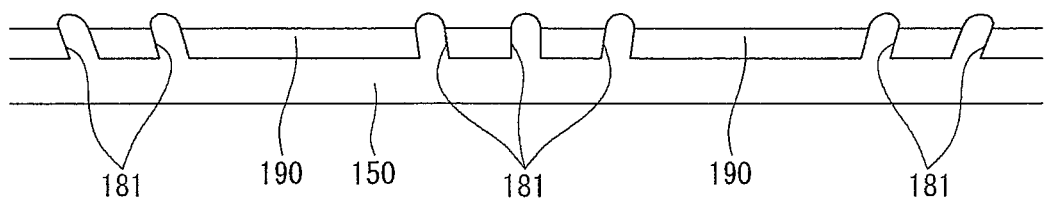

Next, as shown in FIG. 8G, a paste containing Al is coated on a corresponding portion of the passivation layer 190 using the screen printing method and then is dried at about 120° C. to 200° C. to form a rear electrode conductive layer pattern 150 on the passivation layer 190 and on an exposed portion of the substrate 110 exposed by the exposing portions 181.

In the embodiment, a formation order of the patterns 140 and 150 may vary so that the patterns 140 and 150 may be formed together or separately.

Afterwards, a firing process is performed on the substrate 110, on which the front electrode and front electrode current collector pattern 140 and the rear electrode conductive layer pattern 150 are formed, at a temperature of about 750° C. to 800° C. t to form a plurality of front electrodes 141, a plurality of front electrode current collectors 142, a rear electrode conductive layer 155 including a plurality of rear electrodes 151 electrically connected to the substrate 110 through the exposing portions 181, and a plurality of BSF layers 170. As a result, the solar cell 1 shown in FIGS. 1 and 2 is completed.

More specifically, when a thermal process is performed, the plurality of front electrodes 141 and the plurality of front electrode current collectors 142, that pass through the anti-reflection layer 130 of a contact portion and contact the emitter layer 120, are formed due to an element such as Pb contained in the front electrode and front electrode current collector pattern 140. Furthermore, metal components contained in each of the patterns 140 and 150 chemically couples with the layers 120 and 110, and thus a contact resistance is reduced. Hence, a current flow is improved.

When the maximum height H1 of the over-etching portion 183 is less than about 1 μm, a contact strength between the substrate 110 and the rear electrode 151 decreases because of the very small size of the exposed portion of the substrate 110 through the exposing portion 181, and thus a formation effect of the over-etching portion 183 cannot be efficiently obtained.

On the other hand, when the maximum height H1 of the over-etching portion 183 is greater than about 40 μm, the irradiation intensity of the laser beam increases. Hence, atom bonds in an irradiation area of the laser beam and the substrate 110 around the irradiation area are damaged because of heat resulting from the laser beam irradiated onto the passivation layer 190. Namely, a portion of the substrate 110 may be damaged, and a charge transfer efficiency may be reduced.

Further, during the thermal process, Al contained in the rear electrodes 151 is distributed to the substrate 110 contacting the rear electrodes 151 to form a plurality of impurity layers doped with impurities of the same conductive type as the substrate 110, for example, p-type impurities. The plurality of impurity layers form the plurality of BSF layers 170. An impurity doping concentration of the BSF layers 170 is greater than an impurity doping concentration of the substrate 110, and thus the BSF layers 170 are a p+-type area.

In the embodiment, the plurality of BSF layers 170 are formed in a contact area between the rear electrodes 151 and the substrate 110 during a thermal process on the substrate 110 without performing a separate process. Alternatively, a plurality of impurity layers, that are doped with impurities of the same conductive type as the substrate 110 but more heavily than the substrate 110, may be formed on the rear surface of the substrate 110 using a separate process. Here, the impurity layers may serve as the BSF layers 170. The plurality of impurity layers may be formed through the following process. For example, as shown in FIG. 8E, after a plurality of exposing portions 181 are formed on the passivation layer 190, impurities (for example, p-type impurities) of the same conductive type as the substrate 110 are injected into the rear surface of the substrate 110 using the passivation layer 190 as a mask through the CVD method to form the plurality of impurity layers. An impurity doping concentration of each of the plurality of impurity layers may be greater than an impurity doping concentration of the substrate 110, and thus the plurality of impurity layers may be a P+-type layer. Afterwards, a front electrode and front electrode current collector pattern, a rear electrode conductive layer pattern, etc., may be formed, and a firing process may be performed on the substrate 110, on which the front electrode and front electrode current collector pattern, the rear electrode conductive layer pattern, etc., are formed. As a result, a solar cell may be completed.

Exposing portions or exposed portions refer to a portion of the substrate that is exposed by the passivation layer portion, regardless of a technique used to form the exposing portion through the passivasion layer.

In embodiments of the invention, reference to front or back, with respect to electrode, a surface of the substrate, or others is not limiting. For example, such a reference is for convenience of description since front or back is easily understood as examples of first or second of the electrode, the surface of the substrate or others.

While this invention has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A solar cell, comprising:
   a substrate of a first conductive type;
   an emitter layer of a second conductive type opposite the first conductive type on a front face of the substrate;
   at least one first electrode on the emitter layer and electrically connected to the emitter layer;
   a passivation layer on a rear face of the substrate, the passivation layer including a plurality of exposing portions to expose respective portions of the substrate; and
   an electrode conductive layer on the passivation layer, the electrode conductive layer including a plurality of second electrodes electrically connected to the substrate through the respective plurality of exposing portions,
   wherein the plurality of exposing portions include a first exposing portion inclined to the passivation layer, a second exposing portion inclined to the passivation layer, and a third exposing portion positioned between the first exposing portion and the second exposing portion, and
   wherein an inclined angle of the plurality of exposing portions to the passivation layer decreases toward the second exposing portion from the first exposing portion.

2. The solar cell of claim 1, wherein each of the plurality of exposing portions includes an indented portion having an exposed surface of the substrate, and each indented portion has a height ranging from a surface at which the passivation layer is in contact with the substrate to the substrate, and heights of a plurality of indented portions are approximately equal to one another.

3. The solar cell of claim 2, wherein the heights are 1 μm to 40 μm.

4. The solar cell of claim 1, wherein the first exposing portion is substantially perpendicular to the passivation layer and is positioned in a center of the substrate, and the second exposing portion is positioned at an edge of the substrate.

5. The solar cell of claim 1, wherein a plurality of exposing portions formed in the passivation layer along a first direction have the same angle with respect to the passivation layer, and a plurality of exposing portions formed in the passivation layer along a second direction different from the first direction each have different angles with respect to the passivation layer.

6. The solar cell of claim 5, wherein the plurality of exposing portions formed along the second direction is inclined to the passivation layer, and
   inclined angles between the plurality of exposing portions formed along the second direction and the passivation layer increase as the exposing portions formed along the second direction approach an edge of the substrate.

7. The solar cell of claim 1, wherein an angle between the first exposing portion and the second exposing portion is within about 45°.

8. The solar cell of claim 1, wherein a width of each of the plurality of exposing portions is approximately 10 μm to 100 μm.

9. The solar cell of claim 1, wherein the passivation layer and the emitter layer are positioned on the substrate to be on opposite surfaces of the substrate to each other.

10. The solar cell of claim 1, wherein a number of layers constituting the passivation layer is equal to or greater than 2.

11. The solar cell of claim 1, further comprising a plurality of back surface field layers, wherein the plurality of back surface field layers is formed along respective exposed surfaces of the substrate.

12. The solar cell of claim 1, wherein a shape of each of the plurality of exposing portions at the surface at which the passivation layer is in contact with the substrate includes a circle, an oval, a polygon, or a stripe.

13. The solar cell of claim 1, wherein each indented portion has a hemispherical shape, a conical shape, or a polygon pyramid shape.

14. The solar cell of claim 2, wherein the plurality of indented portions include at least two indented portions each having a different shape.

* * * * *